United States Patent
Goetzenberger

(10) Patent No.: US 11,300,634 B2
(45) Date of Patent: Apr. 12, 2022

(54) METHOD FOR DETERMINING A COMPONENT OR MULTIPLE COMPONENTS OF A NUMBER OF COMPONENTS WHICH CAN BE DRIVEN IN A PARALLEL MANNER ACCORDING TO POWER REQUIREMENTS

(71) Applicant: VITESCO TECHNOLOGIES GMBH, Hannover (DE)

(72) Inventor: Martin Goetzenberger, Munich (DE)

(73) Assignee: Vitesco Technologies GmbH, Hannover (DE)

( * ) Notice: Subject to any disclaimer, the term of this patent is extended or adjusted under 35 U.S.C. 154(b) by 0 days.

(21) Appl. No.: 17/045,233

(22) PCT Filed: Mar. 28, 2019

(86) PCT No.: PCT/EP2019/057860
§ 371 (c)(1),
(2) Date: Oct. 5, 2020

(87) PCT Pub. No.: WO2019/192922
PCT Pub. Date: Oct. 10, 2019

(65) Prior Publication Data
US 2021/0165053 A1    Jun. 3, 2021

(30) Foreign Application Priority Data
Apr. 3, 2018 (DE) ..................... 10 2018 204 957.2

(51) Int. Cl.
G01R 31/56 (2020.01)
H02J 1/10 (2006.01)
H02J 13/00 (2006.01)

(52) U.S. Cl.
CPC .............. *G01R 31/56* (2020.01); *H02J 1/102* (2013.01); *H02J 13/00002* (2020.01)

(58) Field of Classification Search
None
See application file for complete search history.

(56) References Cited

U.S. PATENT DOCUMENTS

| 7,675,277 B2 | 3/2010 | Goetzenberger |
| 9,438,222 B2 | 9/2016 | Goetzenberger |
| (Continued) | | |

FOREIGN PATENT DOCUMENTS

| DE | 102006046157 A1 | 4/2008 |
| DE | 102005045889 B4 | 11/2008 |
| (Continued) | | |

*Primary Examiner* — Jared Fureman
*Assistant Examiner* — Aqeel H Bukhari
(74) *Attorney, Agent, or Firm* — Laurence A. Greenberg; Werner H. Stemer; Ralph E. Locher

(57) ABSTRACT

The method determining one or more components of a number of components which can be driven in parallel according to power requirements. A wear value of a respective component is ascertained in dependence on ambient conditions, operating states, the supply voltage, and/or the supply current. An optimal number of components to be operated in parallel is ascertained for a current power requirement and is compared with the currently operated number of components. If the number of currently operated components is greater than the optimal number, the component with the greatest wear value is deactivated. If the number of currently operated components is less than the optimal number, the component or components which can be activated in principle are ascertained and then the activatable component with the lowest wear value is activated.

13 Claims, 6 Drawing Sheets

(56) References Cited

U.S. PATENT DOCUMENTS

| | | |
|---|---|---|
| 2015/0241896 A1 | 8/2015 | Nishibayashi et al. |
| 2017/0063152 A1 | 3/2017 | Hinterberger et al. |
| 2017/0170684 A1* | 6/2017 | Matthey ................ H02J 7/0068 |
| 2017/0288399 A1* | 10/2017 | Fife ................... H02J 13/00028 |

FOREIGN PATENT DOCUMENTS

| | | | |
|---|---|---|---|
| DE | 102013104751 A1 | | 11/2014 |
| DE | 102013220842 A1 | | 4/2015 |
| DE | 102015214236 A1 * | 2/2017 | ............ H02M 3/285 |
| DE | 102015214236 A1 | | 2/2017 |

\* cited by examiner

METHOD FOR DETERMINING A COMPONENT OR MULTIPLE COMPONENTS OF A NUMBER OF COMPONENTS WHICH CAN BE DRIVEN IN A PARALLEL MANNER ACCORDING TO POWER REQUIREMENTS

BACKGROUND OF THE INVENTION

Field of the Invention

When supplying electrical loads such as electric motors or magnetic or piezoelectric injectors, or ohmic loads such as bulbs, which are all installed in large numbers in motor vehicles, large currents often flow through the switching transistors actuating the loads or the energy converters providing a supply voltage, such as DC/DC converters.

In order to avoid excessive loading on the individual switching devices and other components, two or more switching means or DC/DC converters are often connected in parallel. This is described in detail in, for example, DE 10 2005 045 889 B4 and DE 10 2013 220 842 A1. In such parallel connections of current path sections or components, it is important to ensure an even loading during operation, as otherwise one of the sections or components can fail due to increased loading and hence aging, and thus the entire arrangement becomes prematurely unusable.

In the following, the term components is used for components to be connected in parallel, component assemblies or arrangements formed with them.

However, it may also be possible to operate in such a way that not all possible components are always activated, but only those which are essential for optimum operation, in particular for optimum efficiency. Consequently, depending on the load situation, one or more of the maximum possible components must be deactivated in this case, wherein it must be ensured that the same components are not always active and therefore that the same components are not always switched off under reduced demand.

There are approaches to this problem in which the components to be connected in parallel are switched on and off in a rotation principle. However, this can also lead to premature failure of a component, as different load conditions may be present for the individual components. For example, in the operation of one component the ambient temperature may often be higher, or the supply voltage may be higher, or a greater current may flow than in the operation of another component, which can lead to the failure of the more heavily loaded component and thus render the entire arrangement unusable.

BRIEF SUMMARY OF THE INVENTION

It is therefore the object of the invention to achieve an increase in the service life of components to be connected in parallel.

The object is achieved by means of a method as claimed. Advantageous developments are specified in the dependent claims.

Accordingly, in a method for determining a component or multiple components of a number of components which can be driven in a parallel manner according to power requirements, a wear value of a respective component is first ascertained depending on the ambient conditions and/or operating states and/or the supply voltage and/or the supply current. The optimal number of components to be operated in a parallel manner is ascertained for a current power requirement and is compared with the number of components currently being operated.

If the number of currently operated components is greater than the optimum number, the component with the highest wear value is switched off and if the number of currently operated components is less than the optimum number, the component or components that can be activated in principle is/are ascertained, and then the activatable component with the lowest wear value is activated.

In an advantageous extension of the method according to the invention, the activation or deactivation of a component is repeated until the optimal number of components to be operated in parallel is reached.

Therefore, by means of the method according to the invention, depending on the optimum number of components to be operated in parallel, one or more components is always deactivated, where this is not effected according to the rotation principle but depending on which component has the lowest wear value in order then to be activated, or has the highest wear value, in order to be deactivated.

In order to ascertain a wear value, in one design of the method according to the invention a respective wear rate can be ascertained for each component based on an ambient condition or an operating state or the supply voltage or the supply current, and the wear rates thus ascertained for the ambient conditions and/or operating states and/or the supply voltage and/or the supply current that are to be taken into account are summed to give a wear value for the respective component.

The wear value is thus ascertained as a function of wear rates, which in turn depend on the loading of a component due to ambient conditions, such as the ambient temperature or ambient humidity, on operating conditions such as voltages applied to components, currents flowing through them, component temperatures, etc., the supply voltage applied to the component or the injected supply current. For this purpose, one or more threshold values can be defined and it can be ascertained, for example, how long the component has been in operation at a certain temperature at a certain current, in order to ascertain wear rates and a wear value as the sum of the wear rates.

This has the advantage that not only is the operating time taken into account, but also the fact that the operation takes place in more extreme conditions, resulting in a higher wear value and, as a result, other components that may have been in operation for a longer period of time but under normal conditions are switched on or vice versa.

In an extension of this alternative, the individual wear rates can be weighted before the summation.

This can allow, for example, greater weight to be given to operation at an excessive ambient temperature than to operation at an excessive supply voltage.

In a further design of the invention, a component is formed with a number of modules and a respective wear rate is ascertained for each module based on an ambient condition or an operating state or the supply voltage or the supply current, and the wear rates thus ascertained for the ambient conditions and/or operating states to be taken into account and/or the supply voltage and/or the supply current are summed to a partial wear value for the respective module and the maximum partial wear value of these partial wear values for the respective modules is selected as the wear value of the component.

Such a module can consist of only one or a plurality of components. A wear rate is then ascertained for each module for each of the ambient conditions and/or operating states to be taken into account and/or the supply voltage and/or the supply current and these individual wear rates are summed to form a partial wear value for the respective module.

This can take into account the fact that certain components or modules incur greater wear than others under certain operating conditions and that averaging over all modules of a component would not result in an overall lower wear value than would correspond to the actual degree of aging due to the over-stressing of a single module.

In a further variant of the method according to the invention, in which a component is again formed with a number of modules and a respective wear rate is ascertained for each module based on an ambient condition or an operating state or the supply voltage or the supply current, and the wear rates thus ascertained for the ambient conditions and/or operating states to be taken into account and/or the supply voltage and/or the supply current are summed to form a partial wear value for the respective module, of these partial wear values for the respective modules the partial wear value of the module that is classified by an evaluation unit as being critical to the currently prevailing load conditions is selected as the wear value of the component.

Here, the loading conditions are thus also taken into account and the degree of wear of the module for which these loading conditions are most critical is selected as the wear value of the component. For this purpose, an evaluation unit is provided, which contains relevant data from empirical values and which receives corresponding values for the operating conditions and loading conditions as input variables.

In yet another variant of the method according to the invention, in which a component is again formed with a number of modules and a respective wear rate is ascertained for each module based on an ambient condition or an operating state or the supply voltage or the supply current, and the wear rates thus ascertained for the ambient conditions and/or operating states to be taken into account and/or the supply voltage and/or the supply current are summed to form a partial wear value for the respective module, the partial wear values are each multiplied by a specific weighting quantity which is ascertained by an evaluation unit for each module as valid for the currently prevailing load conditions, and the wear value of a component is the sum of the weighted partial wear values.

Thus, the current loading conditions are also taken into account, but it is not only the degree of wear of one module that is taken into account as a wear value, instead the wear value is again formed from all wear rates of all modules, but with a weighting being applied depending on the current loading conditions.

The variants of the method according to the invention can be applied advantageously if a component is a phase section of a multi-phase energy converter, in which two or more phase sections can be connected in parallel.

Since such phase sections can be subjected to high loads under different load conditions, their service life can be considerably increased by taking into account the individual operating conditions.

The invention is explained in more detail below on the basis of exemplary embodiments and with the aid of figures.

DETAILED DESCRIPTION OF THE INVENTION

Figure 1:
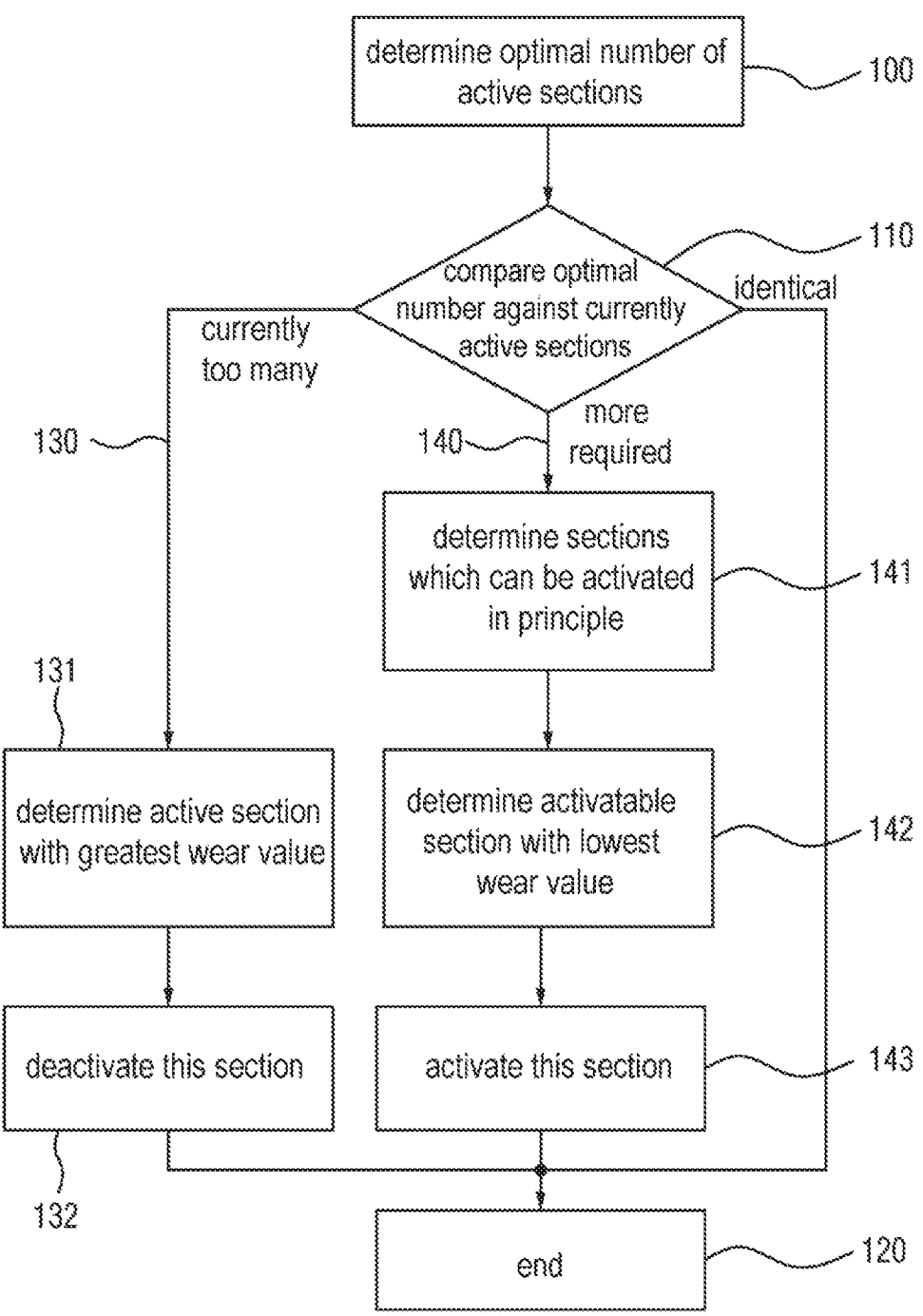
FIG. 1 shows a flow diagram of a method according to the invention.

In the flow diagram of FIG. 1, the optimum number of necessary, activated, parallel connected components, e.g. sections of an energy converter, is first ascertained for the existing load conditions in step 100. Then, at 110, this optimal number is compared with the number of currently active components. If the two numbers are equal, the procedure is terminated 120 until the next start.

If too many components are currently active 130, the component with the highest wear value is determined 131 and then this component is switched off 132. The procedure is then terminated 120.

If there are currently too few components active 140, the components that can be activated in principle are first ascertained 141, then the component with the lowest wear value is ascertained 142 and finally this component is switched on 143. The method is then terminated 120.

Figure 2:
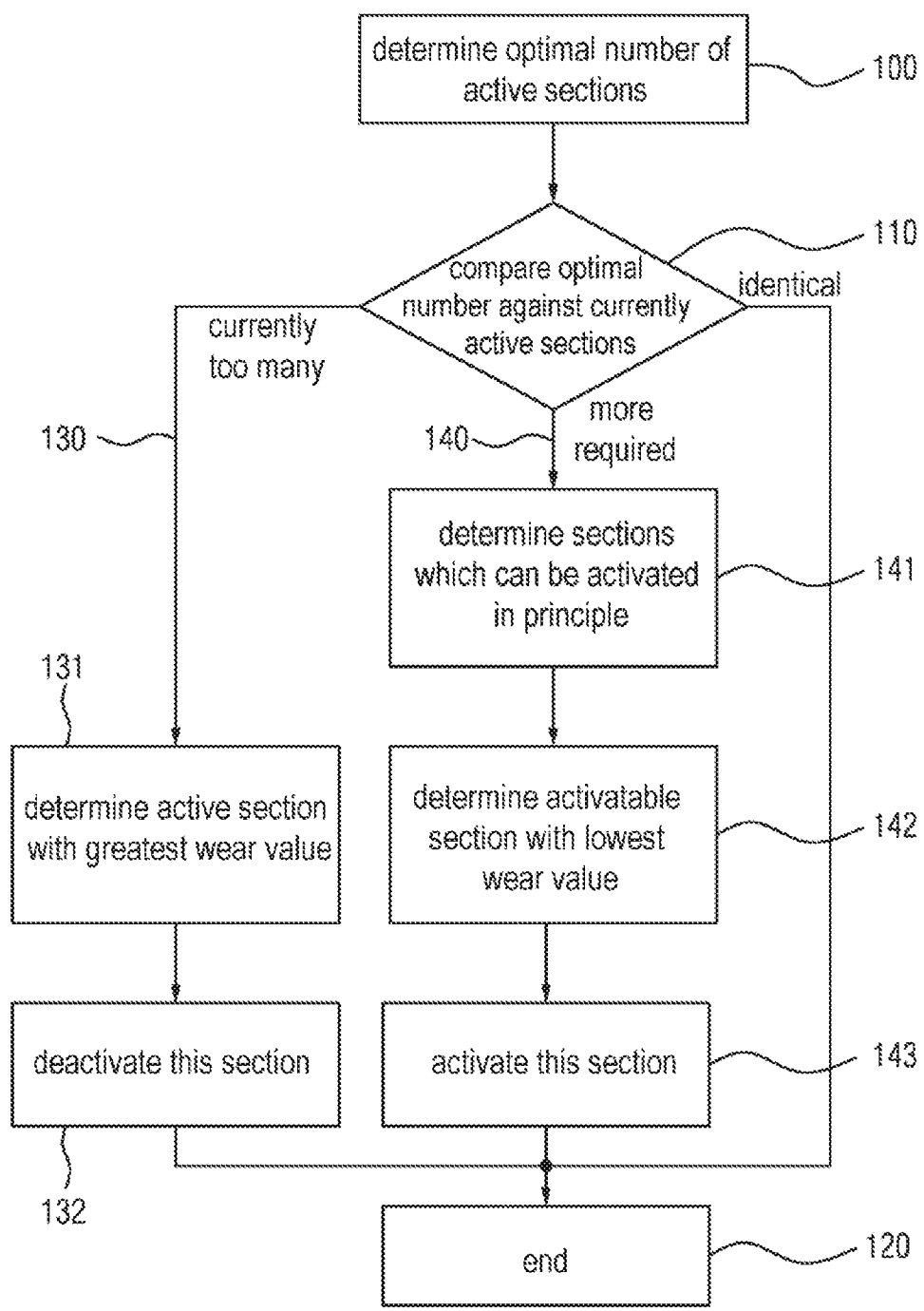
FIG. 2 shows a flow diagram of a variant of the method according to the invention.

According to FIG. 2, the same procedure as in FIG. 1 is carried out, except that after switching off or switching on the components in steps 131 and 143 the procedure is not terminated, but control is returned to the comparison step 110, so that the procedure runs cyclically until the current number of activated components is equal to the optimum number. In the variant of FIG. 1, the procedure may have to be restarted several times in order to achieve the optimum number of components.

Figure 3:
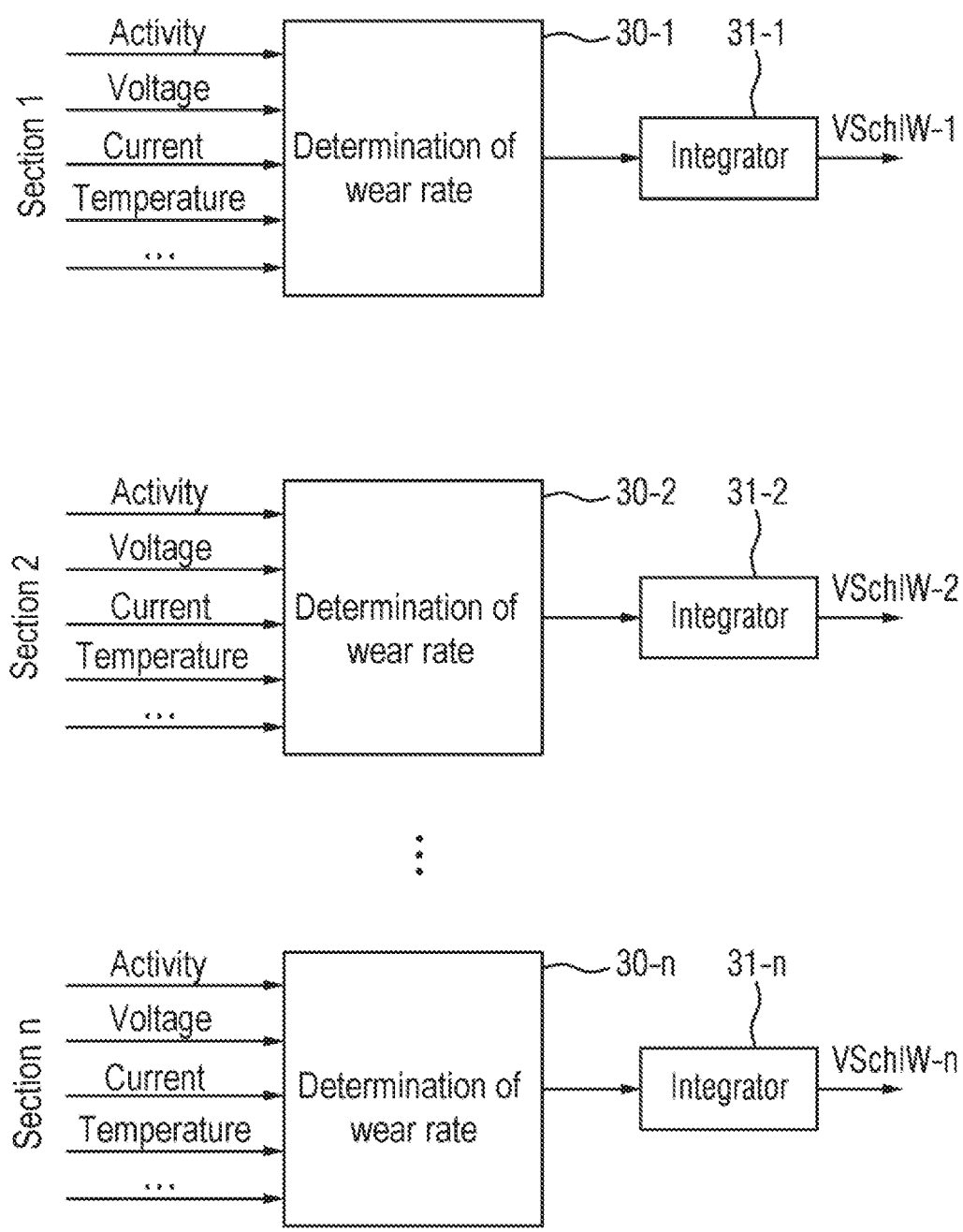
FIG. 3 shows a flowchart of a first variant for determining the wear value of a component.

FIGS. 3 to 6 show methods for determining a wear value for a component. In FIG. 3, a wear rate is first ascertained at 30-1, 30-2, 30-n for each component or for each section 1 to n for each ambient condition—in the example shown, the temperature, but it could also be the air pressure, humidity etc. —, for each operating state—in the example shown, the activity or operating time and the current flowing, these could also be voltages on components etc. —, and for the applied supply voltage or alternatively an injected supply current, based on empirical values.

Then at 31-1, 310-2, 31-n, these wear rates are summed up and a wear value VSchlW-1 . . . VSchlW-n is ascertained for each component.

Figure 4:
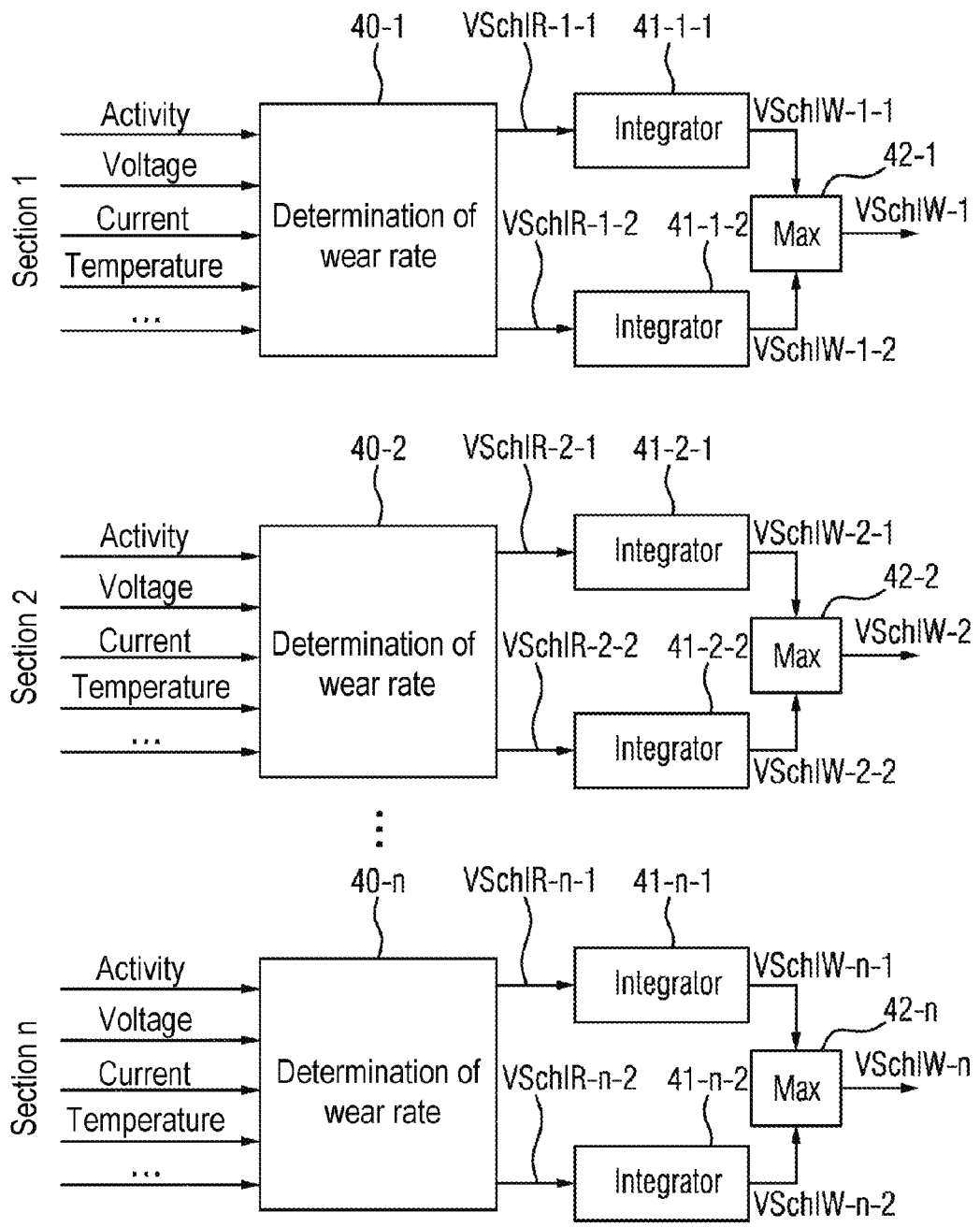
FIG. 4 shows a flowchart of a second variant for determining the wear value of a component.

FIG. 4 shows a variant of the step of ascertaining a wear value VSchlW-1 . . . VSchlW-n for a component, in which the wear rates VSchlR-1-1, VSchlR-1-2, VSchlR-2-1, VSchlR-2-2, . . . VSchlR-n-2 are first ascertained in 40-1, 40-2, . . . 40-n for each module of a component, as described in FIG. 3 for the entire component. In the exemplary embodiment of FIG. 4, each component should have two modules, wherein a module can also consist of only one component, e.g. a transistor or a capacitor.

The wear rates VSchlR-1-1 . . . VSchlR-n-2 of each module are then summed in 41-1-1, 41-1-2, . . . , 41-n-1, 41-n-2.

The partial wear values TVSchlW-1-1 . . . TVSchlW-n-2 thus obtained are evaluated in the following step 42-1, 42-2, . . . , 42-n and for each component the maximum partial wear value is determined as the wear value VSchlW-1 . . . VSchlW-n for the component.

Here, therefore, the most aged module of a component determines its wear value.

Figure 5:
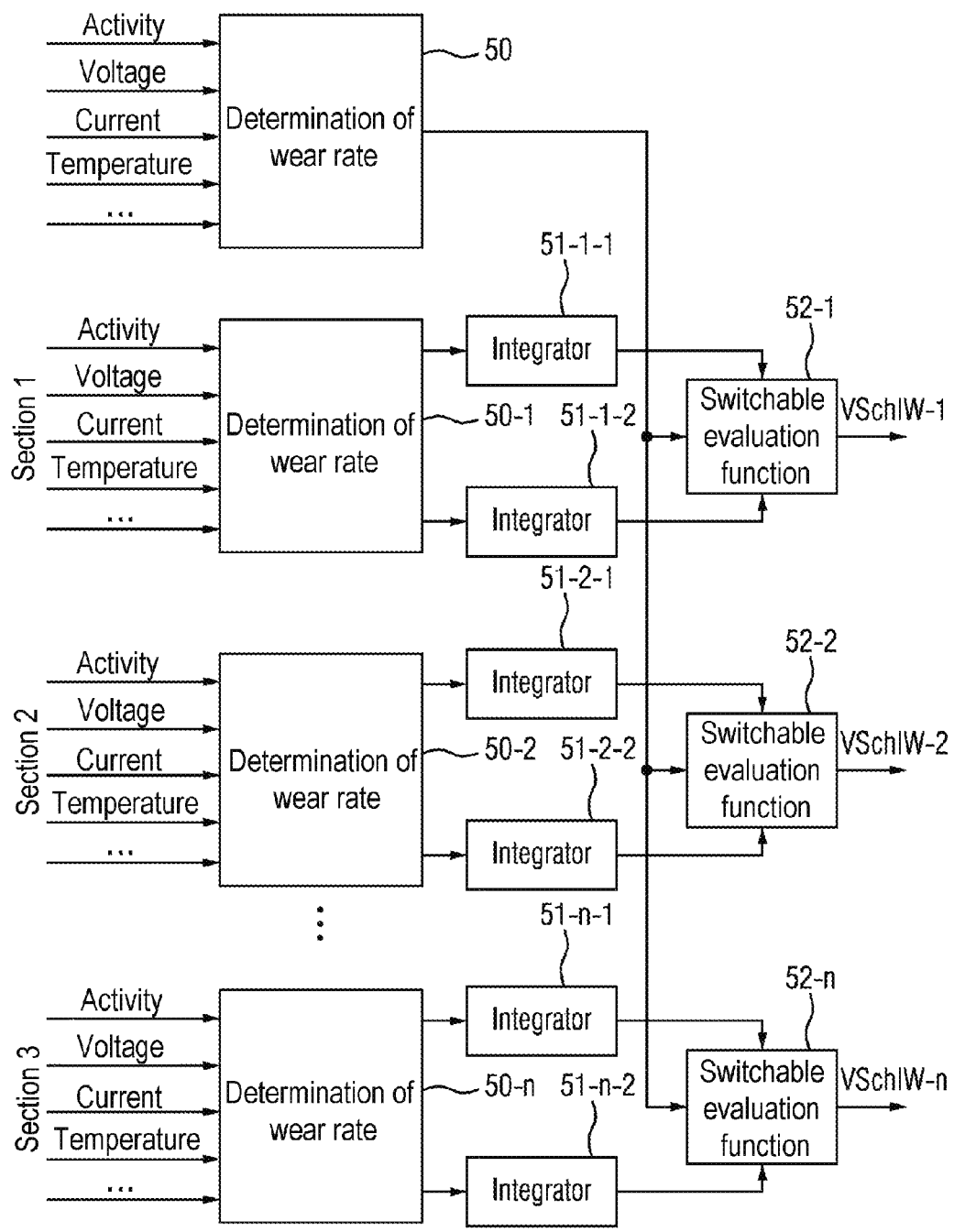
FIG. 5 shows a flowchart of a third variant for determining the wear value of a component.

In the variant of the method according the invention according to FIG. 5, on the other hand, the load-specific critical module is determined 500 depending on the ambient conditions and/or operating states and/or the supply voltage and/or the supply current as well as the load conditions, and depending on this value the wear value of the component is determined 510 from the partial wear value of this module. The other processing steps correspond to those of FIG. 4.

Figure 6:
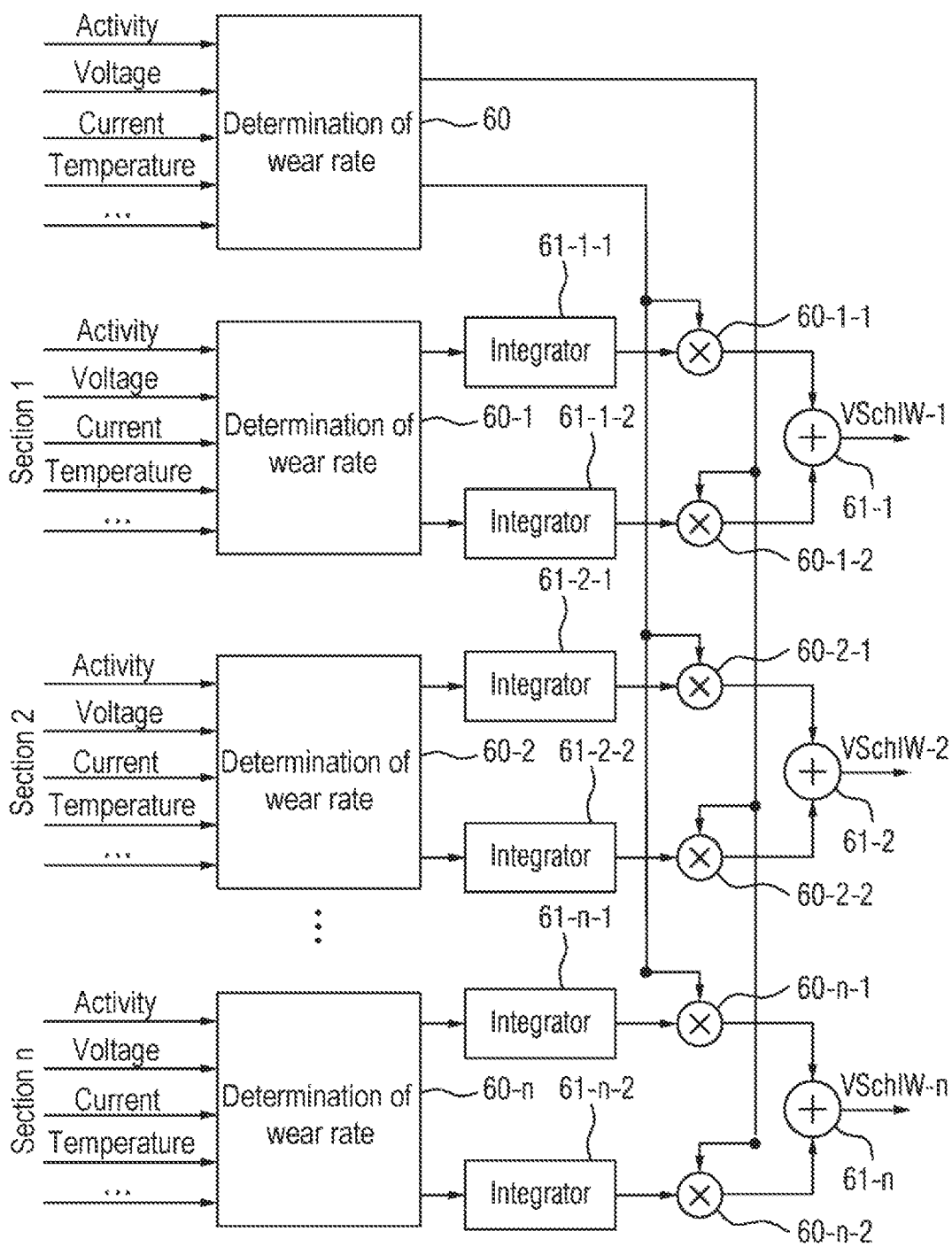
FIG. 6 shows a flowchart of a fourth variant for determining the wear value of a component.

Instead of this hard selection, in the variant of FIG. 6 each partial wear value of a module is multiplied 60-1-1, 60-1-2, . . . , 60-n-2 by a load-specific value, depending on the ambient conditions and/or operating states and/or the supply voltage and/or the supply current as well as the load conditions. The partial wear values of the modules of a component are thus weighted and the sum of these weighted partial wear values is formed in 61-1, 61-2, . . . , 61-n. Thus, a kind of weighted average value of the partial wear values of the modules of a component is formed and defined as the wear value of the component VSchlW-1, VSchlW-2, VSchlW-n.

In the variants of the method according to the invention, on the one hand, the determination of a wear value of a component, i.e. its aging, takes into account the fact that different boundary conditions can lead to different levels of wear. On the other hand, the process of determining a wear value takes into account the fact that different operating states cause different modules of a component to age differently, so that an operating state that causes a module to age particularly fast preferably leads to the selection of a component in which exactly this module is only slightly aged, and vice versa.

The invention claimed is:

1. A method of determining a component or multiple components of a plurality of components which can be driven in parallel according to power requirements, the method comprising:
   ascertaining a wear value of a respective component in dependence on one or more of ambient conditions, operating states, a supply voltage, or a supply current;
   ascertaining a respective wear rate for each component based on an ambient condition or an operating state or the supply voltage or the supply current, and summing the wear rates thus ascertained for the ambient conditions or operating states and/or the supply voltage and/or the supply current to be considered to form a wear value for the respective component;
   determining an optimal number of components to be operated in parallel for a current power requirement and comparing the optimal number of components with a number of currently operated components;
   if the number of currently operated components is greater than the optimal number of components, deactivating the component with a greatest wear value; or
   if the number of currently operated components is less than the optimal number, ascertaining a component or components which can be activated in principle, and activating the activatable component with a lowest wear value.

2. The method according to claim 1, which comprises repeatedly activating or deactivating a component or components until the optimal number of components to be operated in parallel is reached.

3. The method according to claim 1, wherein a component is a phase section of a multi-phase energy converter in which two or more phase sections can be connected in parallel.

4. A method of determining a component or multiple components of a plurality of components which can be driven in parallel according to power requirements, wherein a component is formed with a plurality of modules, the method comprising:
   ascertaining a wear value of a respective component in dependence on one or more of ambient conditions, operating states, a supply voltage, or a supply current;
   ascertaining for each module a respective wear rate based on an ambient condition or an operating state or the supply voltage or the supply current, and summing the wear rates thus ascertained for the ambient conditions or operating states and/or the supply voltage and/or the supply current to be considered to form a partial wear value for the respective module, and selecting a maximum partial wear value of the partial wear values for the respective modules as the wear value of the component;
   determining an optimal number of components to be operated in parallel for a current power requirement and comparing the optimal number of components with a number of currently operated components;
   if the number of currently operated components is greater than the optimal number of components, deactivating the component with a greatest wear value; or
   if the number of currently operated components is less than the optimal number, ascertaining a component or components which can be activated in principle, and activating the activatable component with a lowest wear value.

5. The method according to claim 4, which comprises ascertaining a respective wear rate for each component based on an ambient condition or an operating state or the supply voltage or the supply current, and summing the wear rates thus ascertained for the ambient conditions or operating states and/or the supply voltage and/or the supply current to be considered to form a wear value for the respective component.

6. The method according to claim 5, which comprises weighting individual wear rates prior to summation in the summing step.

7. The method according to claim 5, wherein a component is formed with a plurality of modules and the method comprises ascertaining for each module a respective wear rate based on an ambient condition or an operating state or the supply voltage or the supply current, and summing the wear rates thus ascertained for the ambient conditions or operating states and/or the supply voltage and/or the supply current to be considered to form a partial wear value for the respective module, and selecting a maximum partial wear value of the partial wear values for the respective modules as the wear value of the component.

8. The method according to claim 5, wherein a component is formed with a plurality of modules and the method comprises ascertaining for each module a respective wear rate based on an ambient condition or an operating state or the supply voltage or the supply current, and summing wear rates thus ascertained for the ambient conditions or operating states and/or the supply voltage and/or the supply current to be considered to form a partial wear value for the respective module, and of the partial wear values for the respective modules, selecting the partial wear value of the module that is classified by an evaluation unit as being critical to the currently prevailing load conditions as the wear value of the component.

9. The method according to claim 5, wherein a component is formed with a plurality of modules and the method comprises ascertaining for each module a respective wear rate based on an ambient condition or an operating state or the supply voltage or the supply current, and summing the wear rates thus ascertained for the ambient conditions or operating states and/or the supply voltage and/or the supply current to be considered to form a partial wear value for the respective module, and multiplying each of the partial wear values by a specific weighting quantity which is ascertained by an evaluation unit for each module as valid for the currently prevailing load conditions and the wear value of a component is the sum of the weighted partial wear values.

10. The method according to claim 5, which comprises weighting individual wear rates prior to summation in the summing step.

11. The method according to claim 4, wherein a component is a phase section of a multi-phase energy converter in which two or more phase sections can be connected in parallel.

12. A method of determining a component or multiple components of a plurality of components which can be driven in parallel according to power requirements, wherein a component is formed with a plurality of modules, the method comprising:
ascertaining a wear value of a respective component in dependence on one or more of ambient conditions, operating states, a supply voltage, or a supply current;
ascertaining for each module a respective wear rate based on an ambient condition or an operating state or the supply voltage or the supply current, and summing wear rates thus ascertained for the ambient conditions or operating states and/or the supply voltage and/or the supply current to be considered to form a partial wear value for the respective module, and of the partial wear values for the respective modules, selecting the partial wear value of the module that is classified by an evaluation unit as being critical to the currently prevailing load conditions as the wear value of the component;
determining an optimal number of components to be operated in parallel for a current power requirement and comparing the optimal number of components with a number of currently operated components;
if the number of currently operated components is greater than the optimal number of components, deactivating the component with a greatest wear value; or
if the number of currently operated components is less than the optimal number, ascertaining a component or components which can be activated in principle, and activating the activatable component with a lowest wear value.

13. A method of determining a component or multiple components of a plurality of components which can be driven in parallel according to power requirements, wherein a component is formed with a plurality of modules, the method comprising:
ascertaining a wear value of a respective component in dependence on one or more of ambient conditions, operating states, a supply voltage, or a supply current;
ascertaining for each module a respective wear rate based on an ambient condition or an operating state or the supply voltage or the supply current, and summing the wear rates thus ascertained for the ambient conditions or operating states and/or the supply voltage and/or the supply current to be considered to form a partial wear value for the respective module, and multiplying each of the partial wear values by a specific weighting quantity which is ascertained by an evaluation unit for each module as valid for the currently prevailing load conditions and the wear value of a component is the sum of the weighted partial wear values;
determining an optimal number of components to be operated in parallel for a current power requirement and comparing the optimal number of components with a number of currently operated components;
if the number of currently operated components is greater than the optimal number of components, deactivating the component with a greatest wear value; or
if the number of currently operated components is less than the optimal number, ascertaining a component or components which can be activated in principle, and activating the activatable component with a lowest wear value.

* * * * *